(12) United States Patent
Kikkawa

(10) Patent No.: US 7,989,278 B2
(45) Date of Patent: Aug. 2, 2011

(54) COMPOUND SEMICONDUCTOR DEVICE AND METHOD FOR FABRICATING THE SAME

(75) Inventor: Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 29 days.

(21) Appl. No.: 12/318,577

(22) Filed: Dec. 31, 2008

(65) Prior Publication Data

US 2009/0170249 A1 Jul. 2, 2009

Related U.S. Application Data

(62) Division of application No. 11/265,103, filed on Nov. 3, 2005, now Pat. No. 7,494,855, which is a division of application No. 10/756,472, filed on Jan. 14, 2004, now Pat. No. 7,002,189.

(30) Foreign Application Priority Data

Jan. 15, 2003 (JP) .................................. 2003-006970

(51) Int. Cl.
*H01L 21/338* (2006.01)
(52) U.S. Cl. .......... 438/172; 257/E21.403; 257/E21.407
(58) Field of Classification Search .................. 438/172, 438/167, 191, 604, 606; 257/E21.403, E21.407
See application file for complete search history.

(56) References Cited

U.S. PATENT DOCUMENTS

| 5,182,670 | A | * | 1/1993 | Khan et al. ..................... 359/359 |
|---|---|---|---|---|
| 5,714,006 | A | | 2/1998 | Kizuki et al. ..................... 117/89 |
| 5,929,467 | A | | 7/1999 | Kawai et al. ..................... 257/192 |
| 6,013,926 | A | * | 1/2000 | Oku et al. ..................... 257/284 |
| 6,091,083 | A | | 7/2000 | Hata et al. ..................... 257/79 |
| 6,159,861 | A | | 12/2000 | Asai et al. ..................... 438/706 |
| 6,165,812 | A | * | 12/2000 | Ishibashi et al. ............... 438/46 |
| 6,177,685 | B1 | | 1/2001 | Teraguchi et al. ............. 257/20 |
| 6,203,613 | B1 | | 3/2001 | Gates et al. ..................... 117/104 |

(Continued)

FOREIGN PATENT DOCUMENTS

JP 63-281471 11/1988

(Continued)

OTHER PUBLICATIONS

Japanese Office Action dated Oct. 30, 2007.

(Continued)

*Primary Examiner* — Jarrett J Stark
(74) *Attorney, Agent, or Firm* — Kratz, Quintos & Hanson, LLP

(57) ABSTRACT

The compound semiconductor device comprises an i-GaN buffer layer 12 formed on an SiC substrate 10; an n-AlGaN electron supplying layer 16 formed on the i-GaN buffer layer 12; an n-GaN cap layer 18 formed on the n-AlGaN electron supplying layer 16; a source electrode 20 and a drain electrode 22 formed on the n-GaN cap layer 18; a gate electrode 26 formed on the n-GaN cap layer 18 between the source electrode 20 and the drain electrode 22; a first protection layer 24 formed on the n-GaN cap layer 18 between the source electrode 20 and the drain electrode 22; and a second protection layer 30 buried in an opening 28 formed in the first protection layer 24 between the gate electrode 26 and the drain electrode 22 down to the n-GaN cap layer 18 and formed of an insulation film different from the first protection layer.

6 Claims, 15 Drawing Sheets

U.S. PATENT DOCUMENTS

| | | |
|---|---|---|
| 7,033,961 B1 | 4/2006 | Smart et al. ................... 438/796 |
| 2002/0017696 A1* | 2/2002 | Nakayama et al. ........... 257/471 |
| 2002/0100418 A1 | 8/2002 | Sandhu et al. ................ 118/719 |
| 2002/0171405 A1 | 11/2002 | Watanabe ...................... 323/282 |
| 2005/0077541 A1 | 4/2005 | Shen et al. .................... 257/194 |
| 2006/0043415 A1 | 3/2006 | Okamoto et al. ............. 257/192 |
| 2006/0102929 A1 | 5/2006 | Okamoto et al. ............. 257/189 |
| 2006/0163594 A1 | 7/2006 | Kuzmik .......................... 257/94 |

FOREIGN PATENT DOCUMENTS

| | | |
|---|---|---|
| JP | 07-014851 | 1/1995 |
| JP | 2001210657 | 8/2001 |
| JP | 2002-100639 | 4/2002 |
| JP | 2002-110702 | 4/2002 |
| JP | 2002-359256 | 12/2002 |
| JP | 2004214471 | 7/2004 |

OTHER PUBLICATIONS

Translation of Japanese Office Action dated Oct. 30, 2007.

Translation of Japanese Office Action dated May 13, 2008.

* cited by examiner

COMPOUND SEMICONDUCTOR DEVICE AND METHOD FOR FABRICATING THE SAME

This application is a Divisional Application of prior application Ser. No. 11/265,103 filed on Nov. 3, 2005 now U.S. Pat. No. 7,494,855, which is a Divisional Application of prior application Ser. No. 10/756,472 filed on Jan. 14, 2004, now U.S. Pat. No. 7,002,189 issued Feb. 21, 2006.

CROSS-REFERENCE TO RELATED APPLICATION

This application is based upon and claims priority of Japanese Patent Application No. 2003-6970, filed on Jan. 15, 2003, the contents being incorporated herein by reference.

BACKGROUND OF THE INVENTION

The present invention relates to a compound semiconductor device, more specifically to a compound semiconductor device of a FET structure using gallium nitride (GaN) and a method for fabricating the compound semiconductor device.

GaN belongs to III-V semiconductors gallium arsenic (GaAs), which has been already practically used as an extra high-frequency transistor material, also belongs to. GaN has a characteristic of high carrier mobility, as has GaAs. Furthermore, the band gap of GaN is 3.4 eV, which is higher than the band gap of GaAs, which is 1.4 eV, and GaN has a characteristic that the electric field where the avalanche breakdown takes place is large.

The use of GaN, which has the characteristics of high carrier mobility and the wide bad gap, will be able to realize extra high-frequency devices which can make high voltage resistant operations. Recently, electronic devices, such as HEMTs, etc., including electron transit layers of the GaN of AlGaN/GaN crystal-grown on substrates of sapphire, silicon carbide (SiC), GaN, silicon (Si), etc. are actively developed (refer to, e.g., Japanese Patent Application Unexamined Publication No. 2002-359256).

FIG. 15 is a sectional view of one example of the conventional HEMT structure using AlGaN/GaN hetero junction.

An i-GaN buffer layer 102, an i-AlGaN spacer layer 104, an n-AlGaN electron supplying layer 106 with Si as a dopant impurity implanted in and an i-AlGaN cap layer 108 are laid on a sapphire substrate 100 one on another in the stated order.

A source electrode 110 and a drain electrode 112 of Al/Ti are formed on the i-AlGaN cap layer 108 in ohmic contact with the i-AlGaN cap layer 108. A gate electrode 114 of Au/Ni is formed on the i-AlGaN cap layer 108 between the source electrode 110 and the drain electrode 112 in Schottky contact with the i-AlGaN cap layer 108.

Thus, the HEMT including the i-GaN buffer layer 102 as the electron transit layer, and the n-AlGaN electron supplying layer 106 is constituted.

SUMMARY OF THE INVENTION

An object of the present invention is to provide a compound semiconductor device which can suppress the current collapse and can make high-voltage resistance operation possible, and a method for fabricating the compound semiconductor device.

According to one aspect of the present invention, there is provided a compound semiconductor device comprising: a GaN active layer formed on a semiconductor substrate; an AlGaN electron supplying layer formed on the GaN active layer; a GaN cap layer formed on the AlGaN electron supplying layer; a source electrode and a drain electrode formed on the GaN cap layer; a gate electrode formed on the GaN cap layer between the source electrode and the drain electrode; a first protection layer formed on the GaN cap layer between the source electrode and the drain electrode; and a second protection layer of an insulation layer different from the first protection layer and buried in an opening formed in the first protection layer between the gate electrode and the drain electrode down to the GaN cap layer.

According to another aspect of the present invention, there is provided a compound semiconductor device comprising: a GaN active layer formed on a semiconductor substrate; an AlGaN electron supplying layer formed on the GaN active layer; a GaN cap layer formed on the AlGaN electron supplying layer; a source electrode and a drain electrode formed on the GaN cap layer; a gate electrode formed on the GaN cap layer between the source electrode and the drain electrode; and a first protection layer formed on the GaN cap layer between the source electrode and the drain electrode and having the sides in contact with the gate electrode tapered increasingly forward.

According to further another aspect of the present invention, there is provided a compound semiconductor device comprising: a GaN active layer formed on a semiconductor substrate; an AlGaN electron supplying layer formed on the GaN active layer; a GaN cap layer formed on the AlGaN electron supplying layer and having atomic layer steps formed on the upper surface; a source electrode and a drain electrode formed on the GaN cap layer; and a gate electrode formed on the GaN cap layer between the source electrode and the drain electrode.

According to further another aspect of the present invention, there is provided a method for fabricating a compound semiconductor device comprising: a GaN active layer formed on a semiconductor substrate; an AlGaN electron supplying layer formed on the GaN active layer; a GaN cap layer formed on the AlGaN electron supplying layer; a source electrode and a drain electrode formed on the GaN cap layer; a gate electrode formed on the GaN cap layer between the source electrode and the drain electrode; and a first protection layer formed on the GaN cap layer between the source electrode and the drain electrode, comprising the steps of: forming an opening in the first protection layer between the gate electrode and the drain electrode down to the GaN cap layer; and burying in the opening a second protection layer of an insulation layer different from the first protection layer.

According to further another aspect of the present invention, there is provided a method for fabricating a compound semiconductor device comprising: a GaN active layer formed on a semiconductor substrate; an AlGaN electron supplying layer formed on the GaN active layer; a GaN cap layer formed on the AlGaN electron supplying layer; a source electrode and a drain electrode formed on the GaN cap layer; and a gate electrode formed on the GaN cap layer between the source electrode and the drain electrode, wherein in the step of forming the GaN cap layer, the GaN cap layer is formed with atomic layer steps formed on the upper surface.

As described above, the compound semiconductor device according to the present invention comprises: a GaN active layer formed on a semiconductor substrate; an AlGaN electron supplying layer formed on the GaN active layer; a GaN cap layer formed on the AlGaN electron supplying layer; a source electrode and a drain electrode formed on the GaN cap layer; a gate electrode formed on the GaN cap layer between the source electrode and the drain electrode; a first protection layer formed on the GaN cap layer between the source electrode and the drain electrode; a first protection layer formed on the GaN cap layer between the source electrode and the drain electrode; and a second protection layer of an insulation layer different from the first protection layer and buried in an opening formed in the first protection layer between the gate electrode and the drain electrode down to the GaN cap layer, whereby the current collapse can be suppressed, and the generation of gate leak current can be suppressed. The operation of high voltage resistance can be realized.

The compound semiconductor device according to the present invention comprises: a GaN active layer formed on a semiconductor substrate; an AlGaN electron supplying layer formed on the GaN active layer; a GaN cap layer formed on the AlGaN electron supplying layer; a source electrode and a drain electrode formed on the GaN cap layer; a gate electrode formed on the GaN cap layer between the source electrode and the drain electrode; and a first protection layer formed on the GaN cap layer between the source electrode and the drain electrode and having the sides in contact with the gate electrode tapered increasingly forward, whereby the electric field concentration near the gate electrode is mitigated and the voltage resistance decrease due to the electric field concentration can be suppressed. The operation of high voltage resistance can be realized.

The compound semiconductor device according to the present invention comprises: a GaN active layer formed on a semiconductor substrate; an AlGaN electron supplying layer formed on the GaN active layer; a GaN cap layer formed on the AlGaN electron supplying layer and having atomic layer steps formed on the upper surface; a source electrode and a drain electrode formed on the GaN cap layer; and a gate electrode formed on the GaN cap layer between the source electrode and the drain electrode, whereby the electric field concentration on the surface of the GaN cap layer is mitigated, and the generation of the gate leak current can be suppressed. The operation of high voltage resistance can be realized.

DETAILED DESCRIPTION OF THE INVENTION

The conventional HEMT using the AlGaN/GaN hetero junction has a disadvantage that ON-resistance changes in operation, which are called current collapse, occur.

Furthermore, the amplifiers, etc. presently used in base stations of cellular phones are required to make high-voltage operation, but often voltage resistance of the conventional HEMT using the AlGaN/GaN hetero junction is not sufficient.

Even when the current collapse is successfully suppressed, the gate leak current is increased, which often makes it difficult to make the voltage resistance sufficient.

A First Embodiment

Figure 1:
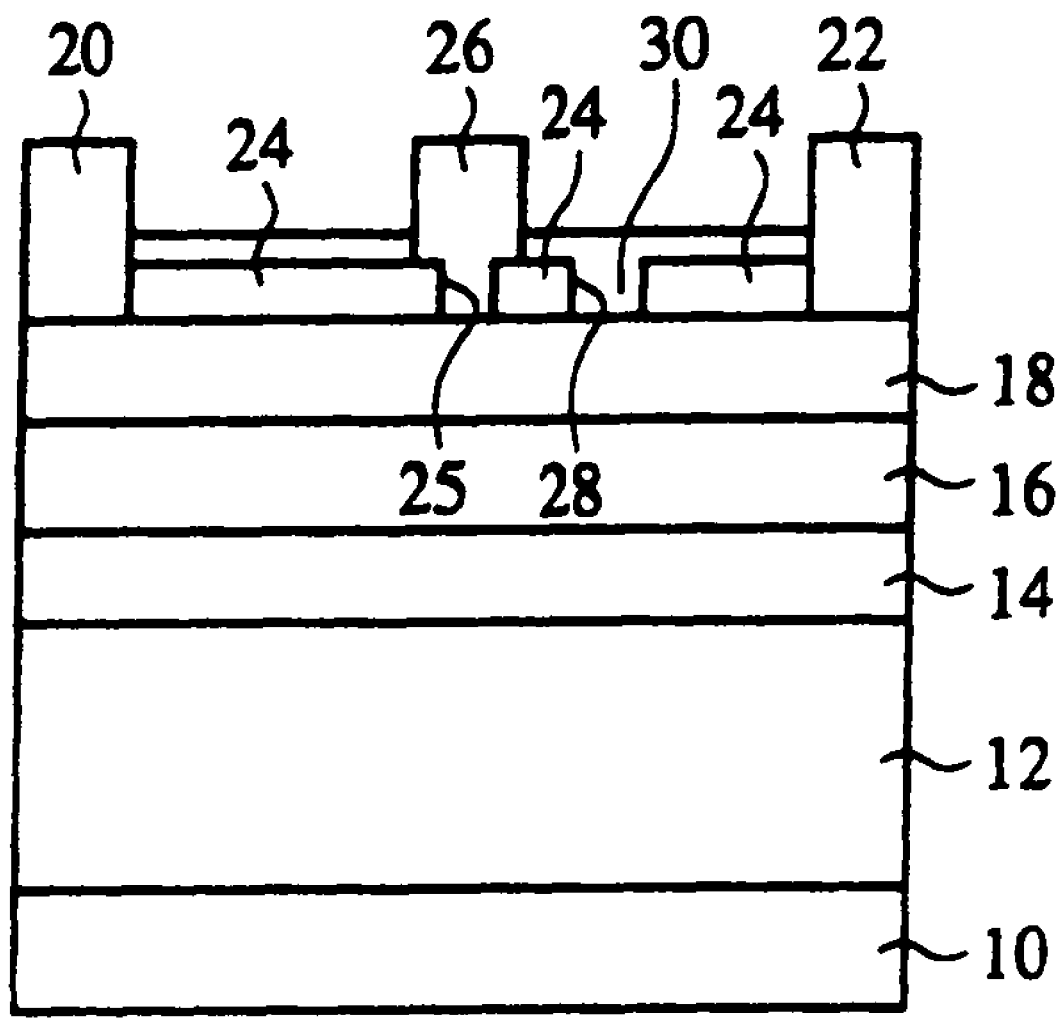
FIG. 1 is a sectional view of the compound semiconductor device according to a first embodiment of the present invention, which shows a structure thereof.
Figure 2:
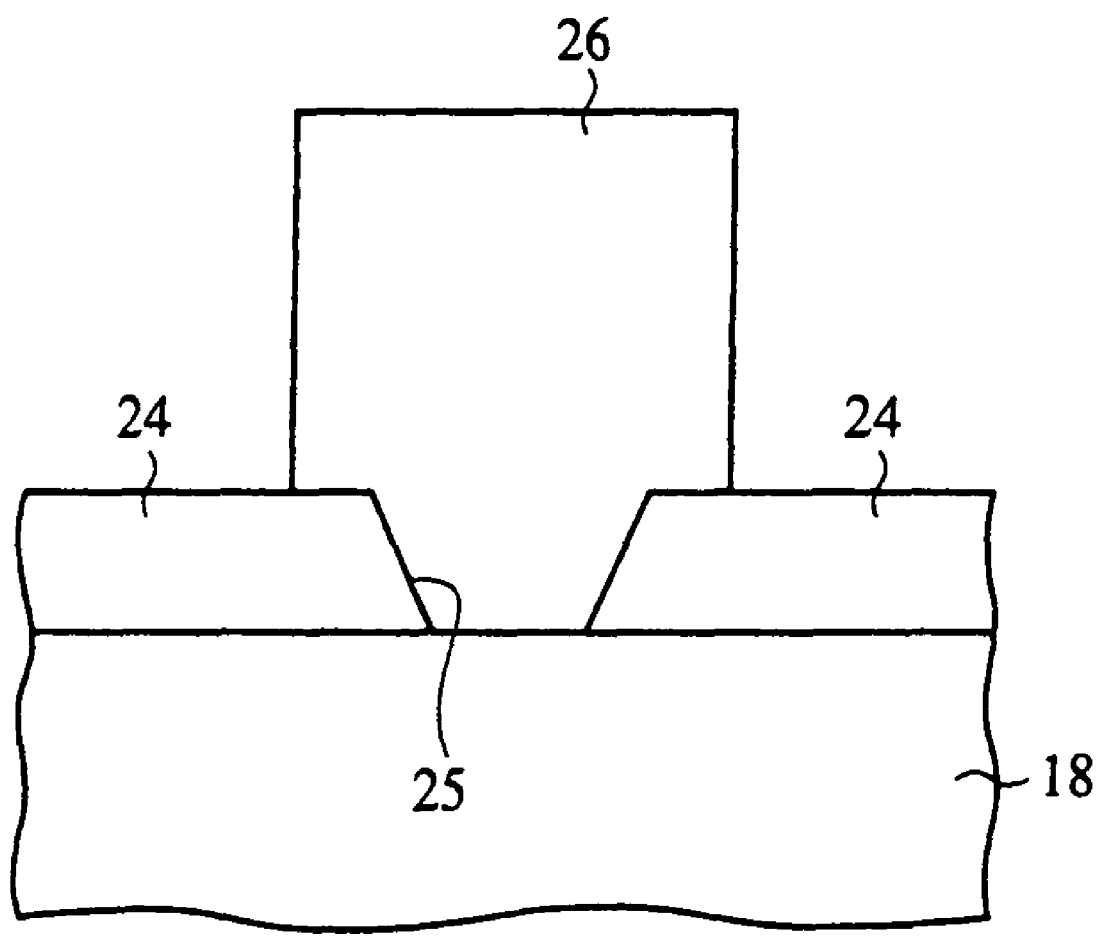
FIG. 2 is an enlarged sectional view of the compound semiconductor device according to the first embodiment of the present invention, which shows a configuration of the gate electrode.
Figure 3:
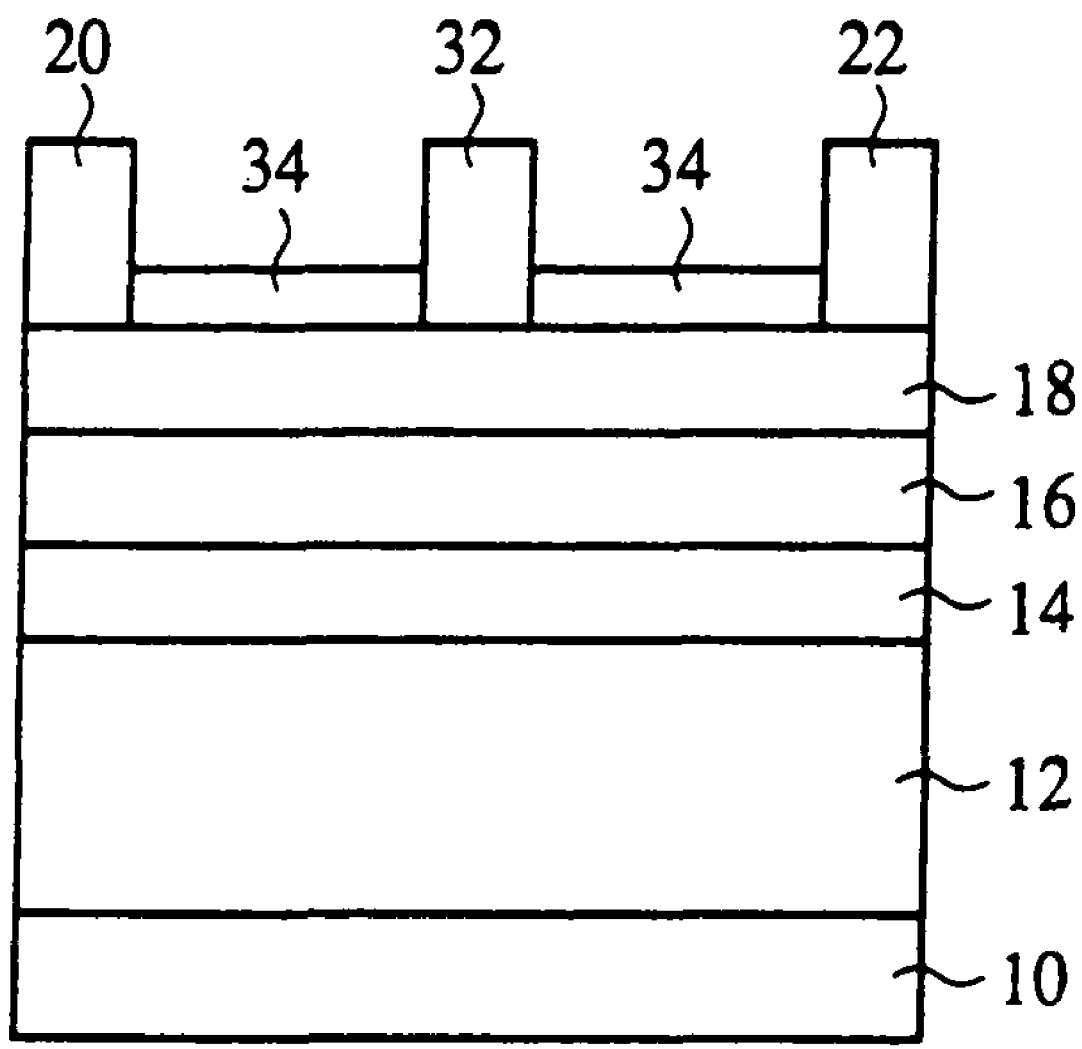
FIG. 3 is a sectional view of the compound semiconductor device including an SiN protection layer formed on an n-GaN cap layer, which shows the structure thereof.

The compound semiconductor device according to a first embodiment and the method for fabricating the compound semiconductor device will be explained with reference to FIGS. 1, 2, 3, 4A-4C, 5A-5C, 6A-6C and 7A-7C. FIG. 1 is a sectional view of the compound semiconductor device according to the present embodiment, which shows a structure thereof. FIG. 2 is an enlarged sectional view of the compound semiconductor device according to the present embodiment, which shows a configuration of the gate electrode. FIG. 3 is a sectional view of the compound semiconductor device with an SiN protection layer formed on an n-GaN cap layer, which show the structure thereof. FIGS. 4A-4C, 5A-5C, 6A-6C and 7A-7C are sectional views of the compound semiconductor device according to the present embodiment in the steps of the method for fabricating the compound semiconductor device, which show the method.

First, the structure of the compound semiconductor device according to the present embodiment will be explained with reference to FIGS. 1 and 2.

As shown in FIG. 1, an i-GaN buffer layer 12, an i-AlGaN spacer layer 14, an n-AlGaN electron supplying layer 16 with Si as a dopant impurity implanted in and an n-GaN cap layer 18 are laid on an SiC substrate 10 one on another in the stated order.

A source electrode 20 and a drain electrode 22 of Al/Ti are formed on the n-GaN cap layer 18 in ohmic contact therewith.

On the n-GaN cap layer 18 between the source electrode 20 and the drain electrode 22, a first protection layer 24 of SiN whose nitrogen content ratio is 20% or less is formed. An opening 25 is formed in the first protection layer 24 down to the n-GaN cap layer 18. Through the opening 25, a gate electrode 26 of Au/Ni is formed on the n-GaN cap layer 18 in Schottky contact therewith, extended on the first protection layer 24. As shown in FIG. 2, the width of the opening 25 with the gate electrode 26 buried in is decreased gradually from the upper surface of the first protection layer 24 toward the upper surface of the n-GaN cap layer 18. That is, the sides of the first protection layer 24 in contact with the gate electrode 26 are tapered increasingly upward.

In the first protection layer 24 between the gate electrode 26 and the drain electrode 22, an opening 28 is formed down to the n-GaN cap layer 18. A second protection layer 30 of SiN whose nitrogen content ratio is 20% or more is formed on the first protection layer 24, filling the opening 28. The opening 28 with the second protection layer 30 buried in is formed, spaced from the gate electrode 26 toward the drain electrode 22 by, e.g., 0.05-0.5 μm.

The different nitrogen content ratios of the first protection layer 24 and the second protection layer 30 makes them different in properties, such as stress, refractive index, etc. For example, the first protection layer 24 of SiN of a 20% or less nitrogen content ratio has a refractive index of 2.4-2.5, and the second protection layer 30 of SiN of a 20% or more nitrogen content ratio has a refractive index 1.9-2.1.

Thus, a HEMT including the i-GaN buffer layer 12 functioning as the electron transit layer, and the n-AlGaN electron supplying layer 16 is constituted.

Device isolation regions (not shown) for isolating the HEMT devices are formed down to the i-GaN buffer layer 12 through the n-GaN cap layer 18, the n-AlGaN electron supplying layer 16 and the i-AlGaN spacer layer 14.

The compound semiconductor device according to the present embodiment is characterized mainly by the first protection layer 24 of SiN, and the second protection layer 30 of SiN buried in the first protection layer 24 between the gate electrode 26 and the drain electrode 22.

In the HEMT using GaN/AlGaN hetero junction, as a structure for suppressing the ON-resistance change in operation, which is called the current collapse, the structure shown in FIG. 3, which uses an n-GaN cap layer and an SiN protection layer is considered. In this structure, as shown, an n-GaN cap layer 18 is formed on an n-AlGaN electron supplying layer 16. Further, an SiN protection layer 34 is formed on the GaN cap layer 18 between a gate electrode 32 and a source electrode 20, and between the gate electrode 32 and a drain electrode 22. The sides of the SiN protection layer 34 in contact with the gate electrode 32 are substantially vertical, as are not in the compound semiconductor device according to the present embodiment shown in FIGS. 1 and 2.

However, the studies by the inventor of the present invention have found that the HEMT of the structure shown in FIG. 3 has a disadvantage that the gate leak current quantity is larger than specifications required by actual devices. That is, the HEMT of the structure has good values of above 100 V or more in the specifications, such as the breakdown voltage resistance and the gate voltage resistance but has large absolute values of the leak current.

The gate leak current of the HEMT of the structure shown in FIG. 3 will be due to the presence of a leak path in the interface between the SiN protection layer 34 and the n-GaN cap layer 18. Even with the Schottky voltage resistance immediately below the gate being sufficient, when a voltage above a pinch-off voltage is applied to the gate electrode, leak current flows from the gate electrode side-wise, causing the voltage resistance decrease.

The second protection layer 30 of the compound semiconductor device according to the present embodiment is formed by forming the opening 28 in the first protection layer 24 and then burying an SiN film in the opening 28, as will be described later. At this time, the surface of the n-GaN cap layer 18 exposed through the opening 28 in the first protection layer 24 is damaged, or oxides are formed thereon. Resultantly, a pinning level is formed between the second protection layer 30 and the n-GaN cap layer 18. Thus, although a path for the leak current is formed between the first protection layer 24 of SiN and the n-GaN cap layer 18, the path is broken immediately below the second protection layer 30, whereby the generation of the leak current can be suppressed. Consequently, the voltage resistance can be improved.

In the present embodiment, the second protection layer 30 is formed on the first protection layer 24, and the second protection layer 30 is buried in the opening 28 between the gate electrode 26 and the drain electrode 22. However, it is not essential to form the second protection layer 30 even on the first protection layer 24, and the second protection layer 30 may be buried in the first protection layer 24 between the gate electrode 26 and the drain electrode 22.

The compound semiconductor device according to the present embodiment is also characterized mainly in that the nitrogen content ratio of SiN which is the material of the first protection layer 24 is below 20% or less. The nitrogen content ratio of SiN forming the first protection layer 24 is below 20% or less, whereby the trap level between the first protection layer 24 and the n-GaN cap layer 18 is decreased. Thus, the so-called current collapse phenomena that the ON-resistance is changed in operation can be suppressed.

Furthermore, the compound semiconductor device according to the present embodiment is also characterized in that, as shown in FIG. 2, the sides of the first protection layer 24 in contact with the gate electrode 26 are tapered increasingly upward. That is, the compound semiconductor device according to the present embodiment is characterized in that the width of the opening 25 which is formed in the first protection layer 24 and in which the gate electrode 26 is buried is gradually decreased from the upper surface of the first protection layer 24 toward the upper surface of the n-GaN cap layer 18.

In the method for fabricating the compound semiconductor device shown in FIG. 3, the SiN protection layer 34 is formed on the n-GaN cap layer 18 between the source electrode 20 and the gate electrode 32 and between the drain electrode 22 and the gate electrode 32 after gate electrode 32 is formed. The interfaces between the SiN protection layer 34 and the gate electrode 32 buried in the SiN protection layer 34 are accordingly substantially vertical. Resultantly, electric fields are concentrated near the corners between the n-GaN cap layer 18 and the gate electrode 32 in Schottky contact therewith, and the voltage resistance is lowered.

In contrast to this, in the compound semiconductor device according to the present embodiment, as shown in FIG. 2, the width of the opening 25 with the gate electrode 26 buried in is gradually decreased from the upper surface of the first protection layer 24 to the upper surface of the n-GaN cap layer 18, whereby the electric field concentration near the corners between the n-GaN cap layer 18 and the gate electrode 26 in Schottky contact therewith is mitigated. Accordingly, the voltage resistance decrease due to the electric field concentration can be suppressed.

In the compound semiconductor device according to the present embodiment, the gate electrode 26 is in Schottky contact with the n-GaN cap layer 18 through the opening 25 formed in the first protection layer 24 and is extended on the first protection layer 24. However, the gate electrode 26 may not be extended on the first protection layer 24. As long as the width of the opening 25 with the gate electrode 26 buried in is gradually decreased from the upper surface of the first protection layer 24 toward the upper surface of the n-GaN cap layer 18, the voltage resistance decrease due to the electric filed concentration can be suppressed.

Next, the method for fabricating the compound semiconductor device according to the present embodiment will be explained with reference to FIGS. 4A-4C, 5A-5C, 6A-6C and 7A-7C.

First, on the SiC substrate 10, the undoped i-GaN buffer layer 12 of, e.g., a 1 μm-thickness is formed by, e.g., MOCVD (Metal Organic Chemical Vapor Deposition).

Next, on the i-GaN buffer layer 12, the undoped i-AlGaN spacer layer 14 of, e.g., 3 nm-thickness is formed by, e.g., MOCVD.

Then, on the i-AlGaN spacer layer 14, the n-AlGaN electron supplying layer 16 of, e.g., a $2\times10^{18}$ cm$^{-3}$ Si dose and a 25 nm-thickness is formed by, e.g., MOCVD.

Next, on the n-AlGaN electron supplying layer 16, the n-GaN cap layer 18 of, e.g., a $5\times10^{18}$ cm$^{-3}$ Si dose and a 5 nm-thickness by, e.g., MOCVD. The film thickness of the n-GaN cap layer 18 is not limited to 5 nm and can be, e.g., 10 nm or less.

Figure 4A:
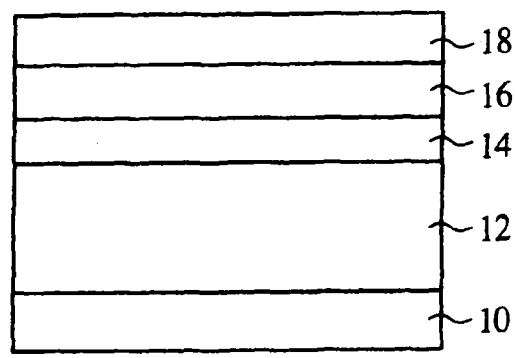
FIGS. 4A-4C are sectional views of the compound semiconductor device according to the first embodiment of the present invention in the steps of the method for fabricating the same, which show the method (Part 1).

Thus, on the SiC substrate 10, the i-GaN buffer layer 12, the i-AlGaN spacer layer 14, the n-AlGaN electron supplying layer 16 and the n-GaN cap layer 18 are laid one on another in the stated order (see FIG. 4A).

Then, Al/Ti is vapor deposited on the n-GaN cap layer 18 in a required region by, e.g., vacuum evaporation to form an Al/Ti film. Then, the Al/Ti film is patterned to form the source electrode 20 and the drain electrode 22 of Al/Ti.

Next, the device isolation regions (not shown) are formed by ion implantation to isolate the HEMT devices.

Figure 4B:
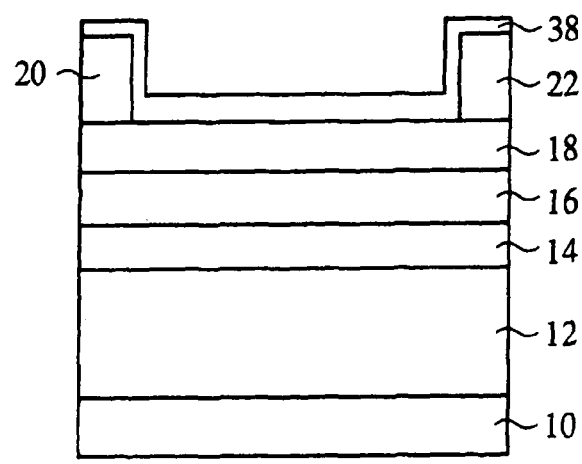

Then, an SiN film 38 whose nitrogen content ratio is 20% or less is formed on the entire surface by, e.g., plasma CVD (se FIG. 4B). The film thickness of the first protection layer 24 can be in the range of, e.g., 10-200 nm.

Figure 4C:
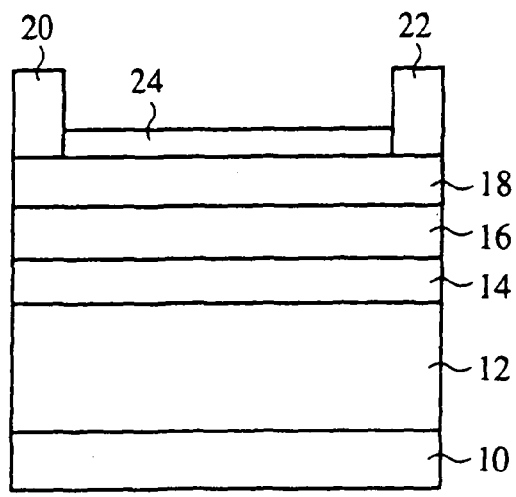

By etching using a mask, the SiN film 38 formed on the entire surface except that formed on the n-GaN cap layer 18 between the source electrode 20 and the drain electrode 22 is removed (see FIG. 4C). Thus, the first protection layer 24 of the SiN film 38 whose nitrogen content ratio is 20% or less is formed the n-GaN cap layer 18 between the source electrode 20 and the drain electrode 22.

Then, a resist for fine gates is applied to the entire surface by, e.g., spin coating to form a resist film 40. Then, the resist film 40 is patterned by photolithography to form the opening 42 in the resist film 40 down to the first protection layer 24 between the source electrode 20 and the drain electrode 22 (see FIG. 5A).

Figure 5A:
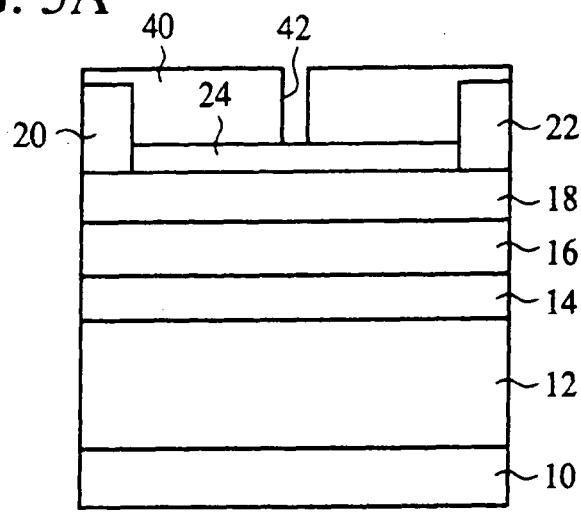
FIGS. 5A-5C are sectional views of the compound semiconductor device according to the first embodiment of the present invention in the steps of the method for fabricating the same, which show the method (Part 2).
Figure 5B:
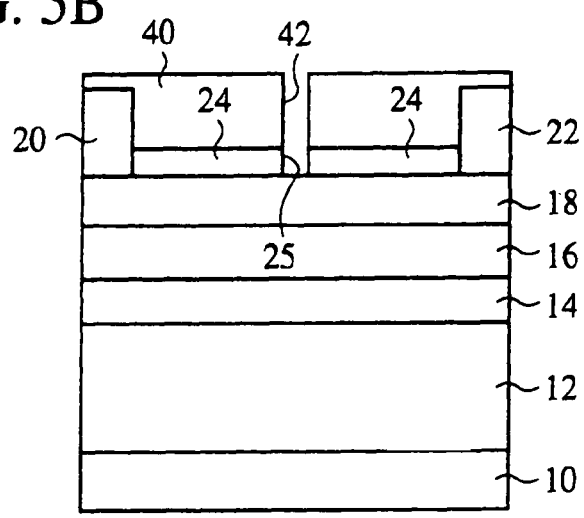
Figure 5C:
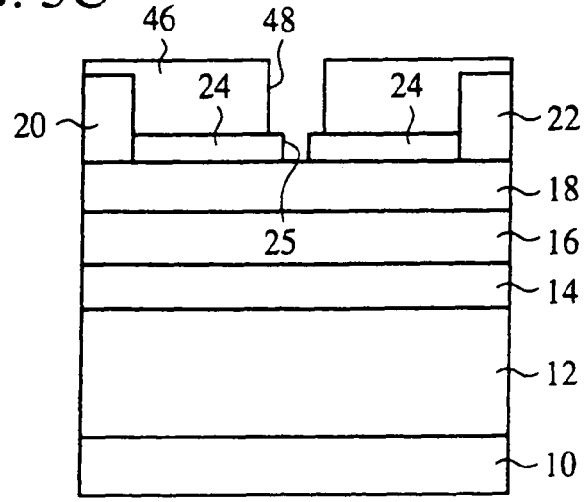

Next, with the resist film 40 with the opening 42 formed in as the mask, dry etching using, e.g., sulfur hexafluoride (SF$_6$) is performed to form the opening 25 in the first protection layer 24 down to the n-GaN cap layer 18 (see FIG. 5B). At this time, for example, the dry etching using SF$_6$ is performed down to the n-GaN cap layer 18 by isotropic etching at a below 300 angstrom/min etching rate. The dry etching is followed by side etching with an HF-based etching liquid at an etching rate of about 100 angstrom/min. Thus, the sides of the first protection layer 24 which are exposed in the opening 25 and are to be brought into contact with the gate electrode can be tapered increasingly upward.

After the opening 25 has been formed in the first protection layer 24, the resist film 40 used as the mask is removed.

Then, a resist is applied to the entire surface by, e.g., spin coating to form a resist film 46. Then, the resist film 46 is patterned by photolithography to form an opening 48 for exposing a wider region than the opening 25, which contains the region where the opening 25 has been formed in the first protection layer 24 (see FIG. 5C).

Figure 6A:
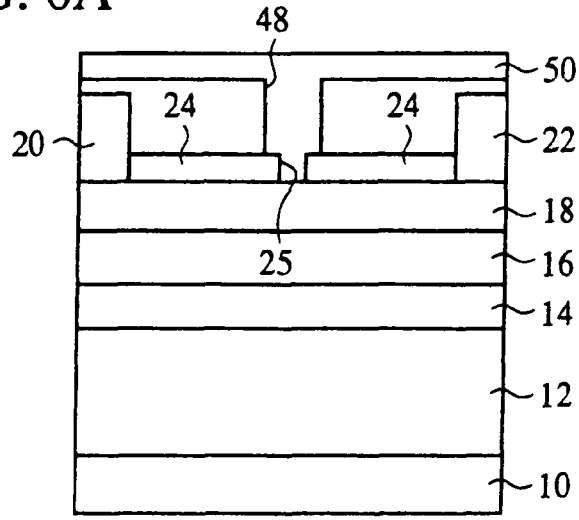
FIGS. 6A-6C are sectional views of the compound semiconductor device according to the first embodiment of the present invention in the steps of the method for fabricating the same, which show the method (Part 3).
Figure 6B:
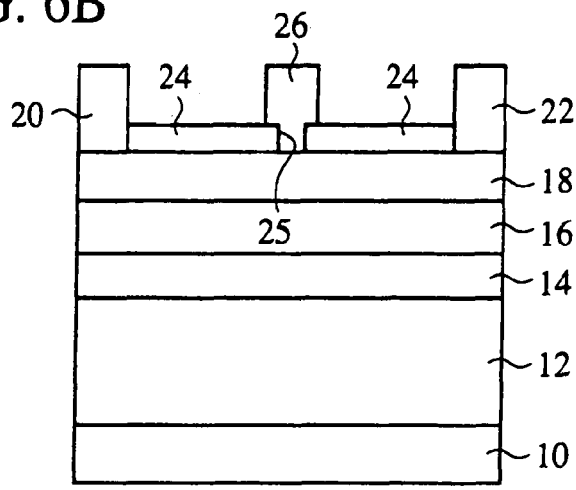
Figure 6C:
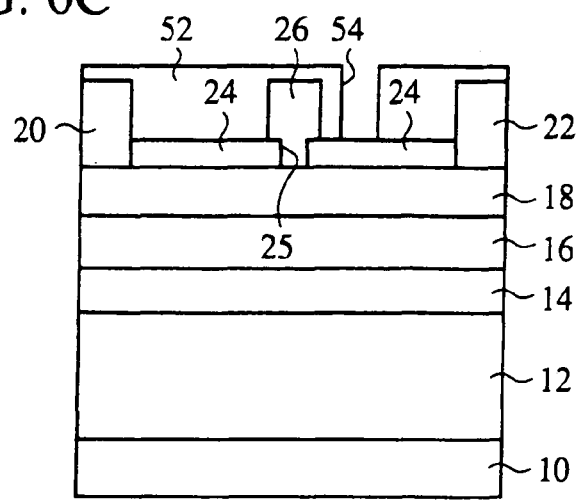

Next, Au/Ni is vapor deposited on the entire surface by, e.g., vacuum vapor deposition to form an Au/Ni film 50 (see FIG. 6A). Subsequently, the resist film 46 is removed to lift off the unnecessary Au/Ni film 50. Thus, the gate electrode 26 of the Au/Ni having the configuration in which the part higher than the first protection layer 24 overhangs on the first protection layer 24 is formed (see FIG. 6B).

Next, a resist is applied to the entire surface by, e.g., spin coating to form a resist film 52. Then, the resist film 52 is patterned by photolithography to form an opening 54 in the resist film 52 down to the first protection layer 24 in a prescribed region between the gate electrode 26 and the drain electrode 22 (see FIG. 6C).

Figure 7A:
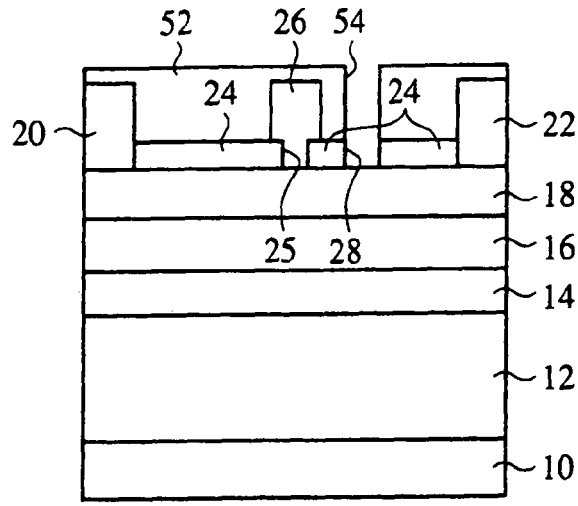
FIGS. 7A-7C is sectional views of the compound semiconductor device according to the first embodiment of the present invention in the steps of the method for fabricating the same, which show the method (Part 4).

Next, with the resist film 52 with the opening 54 formed in as the mask, dry etching using, e.g., SF$_6$ to form an opening 28 in the first protection layer 24 in a prescribed region between the gate electrode 26 and the drain region 22 down to the n-GaN cap layer 18 (see FIG. 7A). After the opening 28 has been formed, the resist film 52 used as the mask is removed.

Figure 7B:
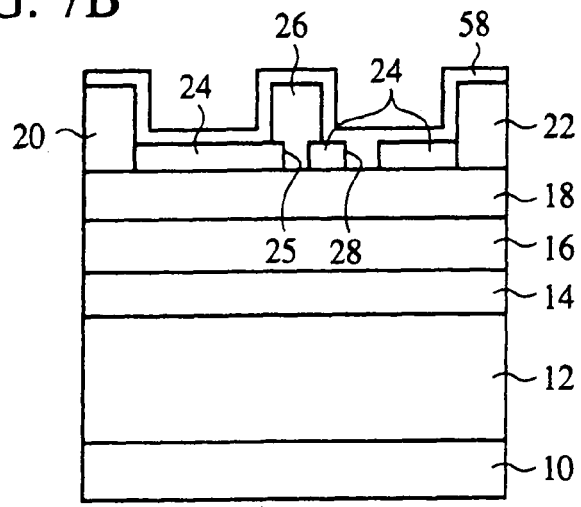

Then, an SiN film 58 of a nitrogen content ratio of 20% or more is formed on the entire surface by, e.g., plasma CVD (see FIG. 7B).

Figure 7C:
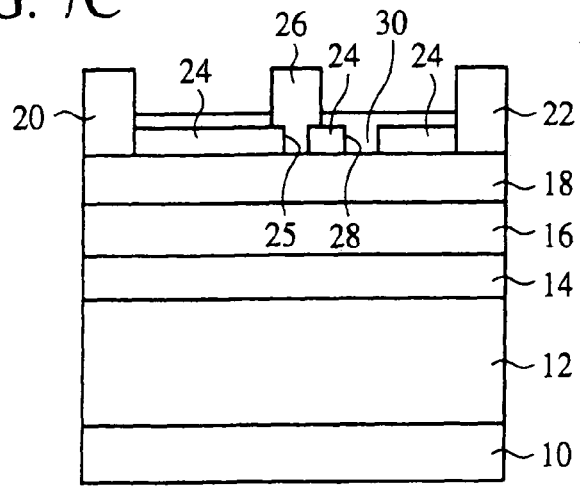

Then, by etching using a mask, the SiN film 58 formed on the entire surface except that formed on the first protection layer 24 between the source electrode 20 and the drain electrode 22 is removed (see FIG. 7C). Thus, on the first protection layer 24, the second protection layer 30 is formed of the SiN film 58 of a 20% or more nitrogen content ratio buried in the opening 28 formed in the first protection layer 24.

Thus, the compound semiconductor device according to the present embodiment shown in FIG. 1 is fabricated.

Figure 8:
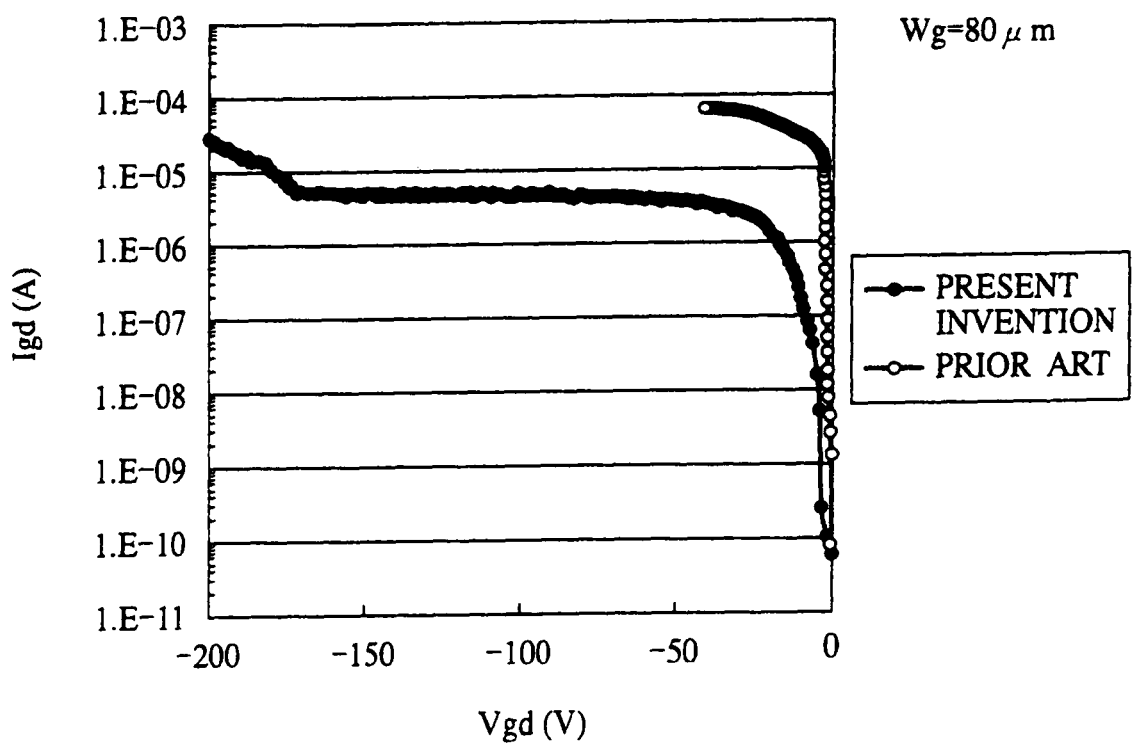
FIG. 8 is a graph of one example of the gate leak current decreasing effect by the compound semiconductor device according to the first embodiment of the present invention.

FIG. 8 is a graph of one example of the gate leak current decreasing effect of the compound semiconductor device according to the present embodiment fabricated in the process described above. On the compound semiconductor device according to the present embodiment shown in FIG. 1 and the compound semiconductor device shown in FIG. 3, the gate voltage $V_g$ was swept to measure the gate current $I_g$. In FIG. 8, the graph indicated by the ● marks is of changes of $I_g$ for $V_g$ measured on the compound semiconductor device according to the present embodiment. In FIG. 8, the graph indicated by the ○ marks is of changes of $I_g$ for $V_g$ measured on the compound semiconductor device. In the graph of FIG. 8, $-V_g$ is taken on the horizontal axis, and $-I_g$ is taken on the vertical axis.

As evident in the graph of FIG. 8, the compound semiconductor device according to the present embodiment sufficiently decreases the leak current in comparison with the compound semiconductor device shown in FIG. 3.

As described above, the compound semiconductor device according to the present embodiment includes the first protection layer 24 of SiN, and the second protection layer 30 buried in the first protection layer 24 between the gate electrode 26 and the drain electrode 22 and formed of SiN which is different from the SiN forming the first protection layer 24, whereby the path of leak current formed between the first protection layer 24 and the n-GaN cap layer 18 is broken immediately below the second protection layer to thereby suppress the generation of leak current. Accordingly, the voltage resistance can be improved.

According to the present embodiment, the nitrogen content ratio of SiN forming the first protection layer 24 is set at 20% or less, whereby the trap level between the first protection layer 24 and the n-GaN cap layer 18 can be less. Thus, the occurrence of the so-called current collapse phenomena that the ON-resistance changes in operation can be suppressed.

According to the present embodiment, the sides of the first protection layer 24 in contact with the gate electrode 26 are tapered increasingly upward, whereby the electric field concentration near the corners between the n-GaN cap layer 18 and the gate electrode 26 in Schottky contact with the n-GaN cap layer 18 in the opening 25 is mitigated. Thus, the voltage resistance decrease due to the electric field concentration can be suppressed.

In the present embodiment, the gate electrode 26 is formed on the n-GaN cap layer 18 in Schottky contact therewith through the opening 25, extended on the first protection layer 24. However, the gate electrode is not limited to this configuration.

Figure 9:
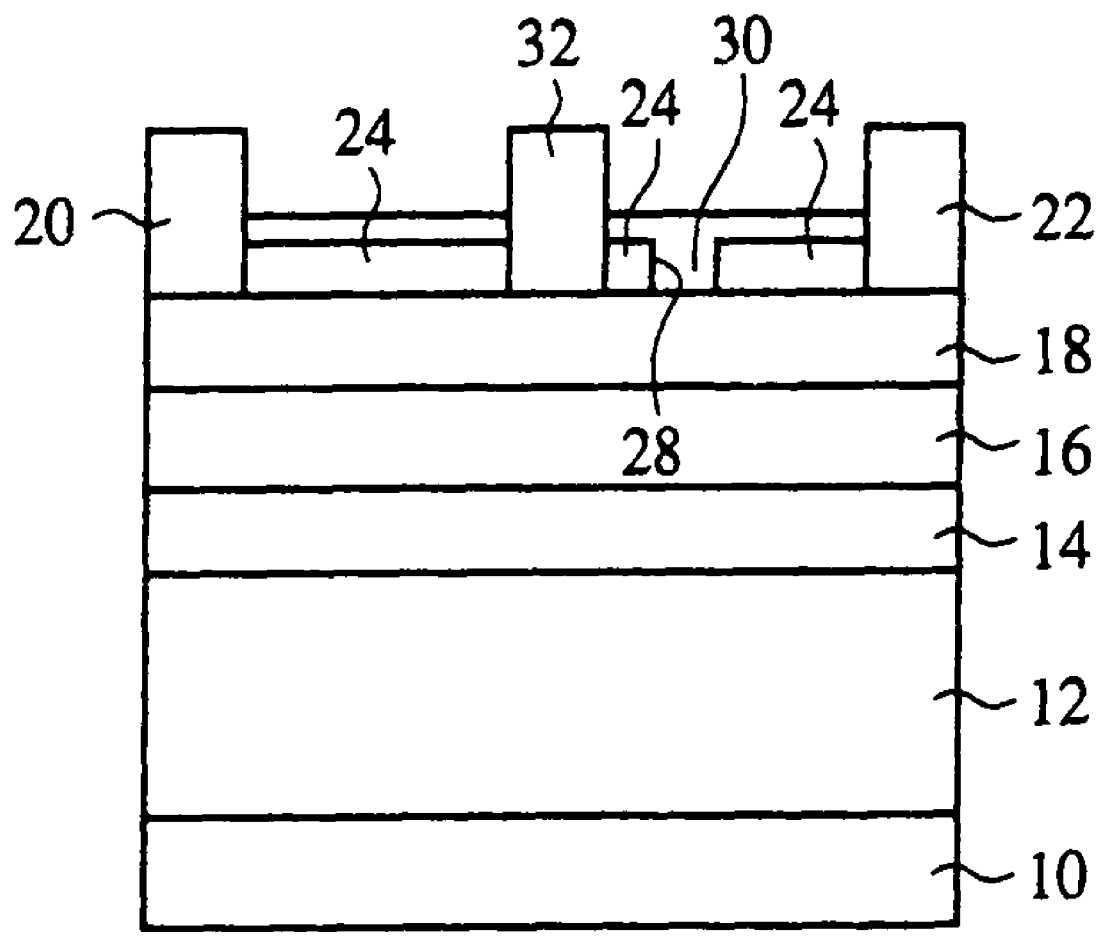
FIG. 9 is a sectional view of the compound semiconductor device according to one modification of the first embodiment of the present invention, which shows a structure thereof.

For example, the gate electrode may have the same configuration as that of the compound semiconductor device shown in FIG. 3. In this case, as shown in FIG. 9, the source electrode 20 and the drain electrode 22 of Al/Ti are formed on the n-GaN cap layer 18 in ohmic contact therewith. On the n-GaN cap layer 18 between the source electrode 20 and the drain electrode 22, the gate electrode 32 of Au/Ni is formed in Schottky contact therewith. The first protection layer 24 of SiN of a nitrogen content ratio of 20% or less is formed on the n-GaN cap layer 18 between the gate electrode 32 and the source electrode 20 and between the gate electrode 32 and the drain electrode 22. An opening 28 is formed in the first protection layer 24 between the gate electrode 32 and the drain electrode 22 down to the n-GaN cap layer 18. The second protection layer 30 of a nitrogen content ratio of 20% or more is buried in the opening 28.

In the compound semiconductor device shown in FIG. 9 as well, the second protection layer 30 is buried in the first protection layer 24 between the gate electrode 32 and the drain electrode 22, whereby the generation of the gate leak current is suppressed, and the voltage resistance is improved.

The compound semiconductor device shown in FIG. 9 can be fabricated as follows. The source electrode 20, the drain electrode 22 and the gate electrode 32 are formed respectively on the n-GaN cap layer 18, and then the first protection layer 24 of SiN is formed on the entire surface. Next, by etching using a mask, the first protection layer 24 formed on the entire surface is removed except that formed between the gate electrode 32 and the source electrode 20 and between the gate electrode 32 and the drain electrode 22 formed on the n-GaN cap layer. Then, in the same way as in the present embodiment described above, the opening 28 is formed in the first protection layer 24 between the gate electrode 32 and the drain electrode 22, and the second protection layer 30 is buried in the opening 28. Thus, the compound semiconductor device shown in FIG. 9 is fabricated.

A Second Embodiment

Figure 10:
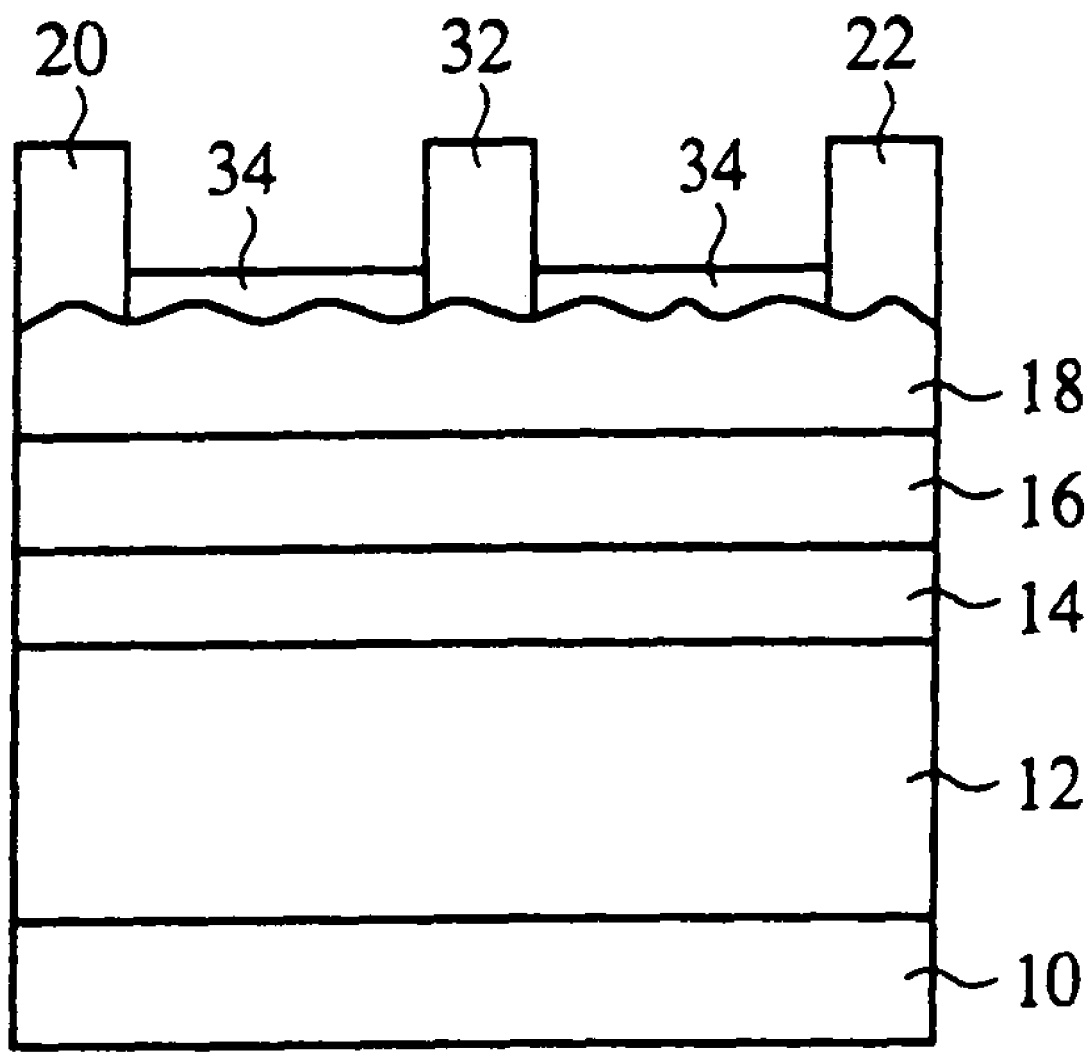
FIG. 10 is a sectional view of the compound semiconductor device including the n-GaN cap layer having large surface roughness, which shows a structure thereof.
Figure 11:
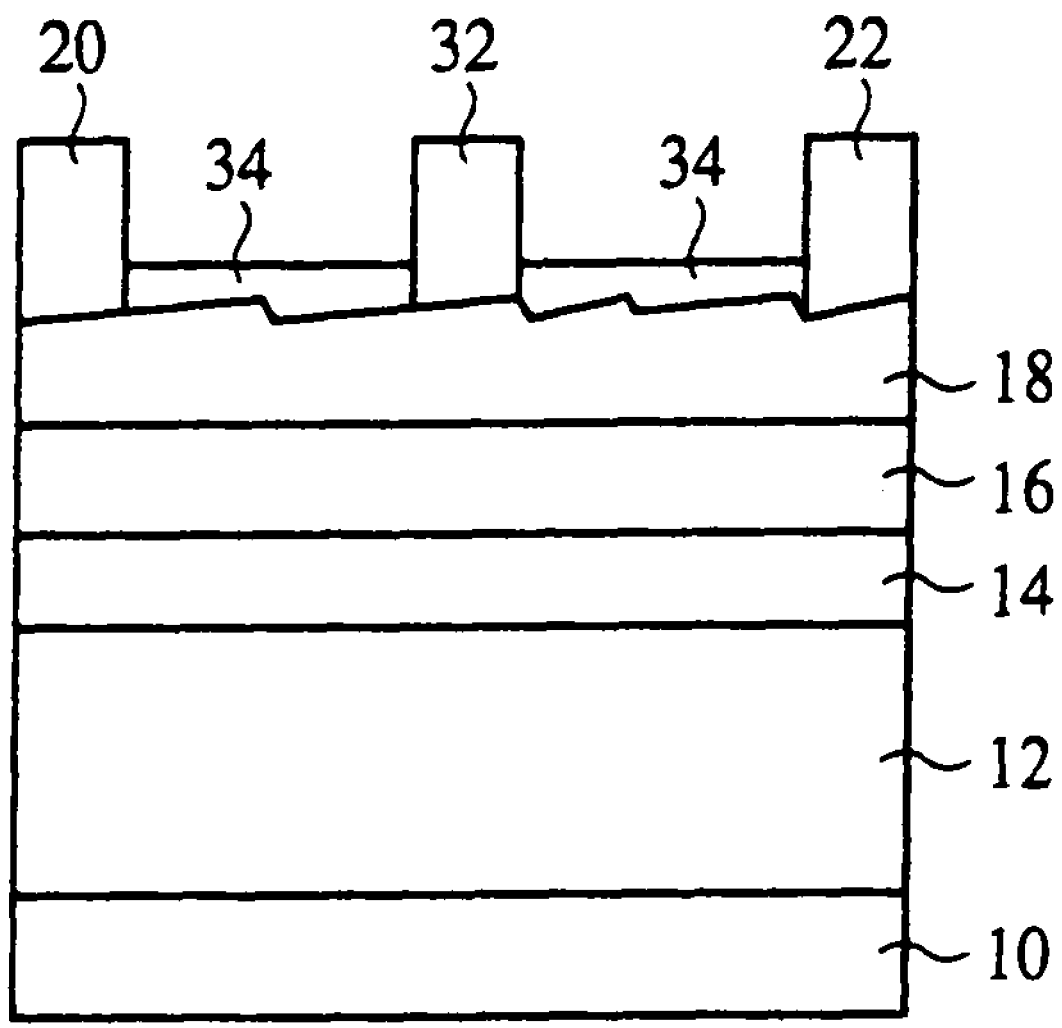
FIG. 11 is a sectional view of the compound semiconductor device according to a second embodiment of the present invention, which shows a structure thereof.

The compound semiconductor device according to a second embodiment of the present invention and the method for fabricating the compound semiconductor device will be explained with reference to FIGS. 10, 11, 12A-12C and 13A-13C. FIG. 10 is a sectional view of the compound semiconductor device including an n-GaN cap layer whose surface roughness is large, which shows the structure thereof. FIG. 11 is a sectional view of the compound semiconductor device according to the present embodiment, which shows a structure thereof. FIGS. 12A-12C and 13A-13C are sectional views of the compound semiconductor device according to the present embodiment in the steps of the method for fabricating the compound semiconductor device. The same members of the present embodiment as those of the compound semiconductor device according to the first embodiment and the method for fabricating the semiconductor device are represented by the same reference numbers not to repeat or to simplify their explanation.

As in the steps for fabricating the compound semiconductor device shown in FIG. 3, in growing an AlGaN layer it is difficult to grow the surface flat. When the n-GaN cap layer 18 is formed, the film thickness is insufficient, and depending on the temperature increase or decrease conditions, etc. upon forming the film, the upper surface of the formed n-GaN cap layer 18 is rough as shown in FIG. 10. For example, the surface roughness of the n-GaN cap layer 18 has large values of 10 angstrom or more.

Such large roughness of the n-GaN cap layer 18 causes partial electric field concentration on the upper surface, which is one factor for generating the gate leak current. In order to suppress the generation of the gate leak current to improve the voltage resistance, the upper surface of the n-GaN cap layer 18 must be flatter.

In the compound semiconductor device according to the present embodiment, the n-GaN cap layer 18 is formed under prescribed growing conditions to reduce the surface roughness of the n-GaN cap layer 18, whereby the electric field concentration on the upper surface of the n-GaN cap layer 18 to thereby suppress the generation of the gate electrode.

First, the structure of the compound semiconductor device according to the present embodiment will be explained with reference to FIG. 11.

An i-GaN buffer layer 12, an i-AlGaN spacer layer 14, an n-AlGaN electron supplying layer 16 with Si as a dopant impurity implanted in and an n-GaN cap layer 18 are formed on an SiC substrate 10 one on another in the stated order. The n-GaN cap layer 18 has a stepped upper surface of, e.g., 1-5 nm height atomic layer steps formed of several atomic layers laid one on another. The surface roughness of the n-GaN cap layer 18 is as small as 0.1-5 angstrom.

A source electrode 20 and a drain electrode 22 of Al/Ti are formed on the n-GaN cap layer 18 having the stepped surface in ohmic contact therewith. A gate electrode 32 of Au/Ni is formed on the n-GaN cap layer 18 between the source electrode 20 and the drain electrode 22 in Schottky contact therewith.

An SiN protection layer 34 is formed on the n-GaN cap layer 18 between the gate electrode 32 and the source electrode 20 and between the gate electrode 32 and the drain electrode 22. The nitrogen content ratio of the SiN protection layer 34 may be, e.g., 20% or less, as is of the first protection layer 24 of the compound semiconductor device according to the first embodiment. Thus, the generation of the current collapse can be suppressed, as can in the first embodiment.

The compound semiconductor device according to the present embodiment is characterized mainly by the n-GaN cap layer 18 having the atomic layers formed in steps on the upper surface and having the upper surface of small roughness in the form of steps. The small roughness of the upper surface of the n-GaN cap layer 18 mitigates the electric field concentration on the upper surface of the n-GaN cap layer 18, whereby the generation of the gate leak current can be suppressed, and the voltage resistance can be improved.

Then, the method for fabricating the compound semiconductor device according to the present embodiment will be explained with reference to FIGS. 12A-12C and 13A-13C.

Figure 12A:
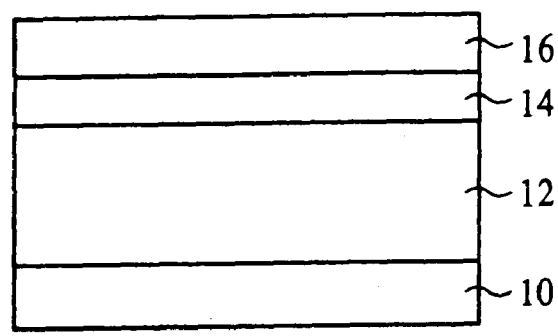
FIGS. 12A-12C are sectional views of the compound semiconductor device in the steps of the method for fabricating the same, which show the method (Part 1).

First, in the same way as in the first embodiment, the i-GaN buffer layer 12, the i-AlGaN space layer 14 and the n-AlGaN electron supplying layer 16 are sequentially formed on the SiC substrate 10 (see FIG. 12A).

Figure 12B:
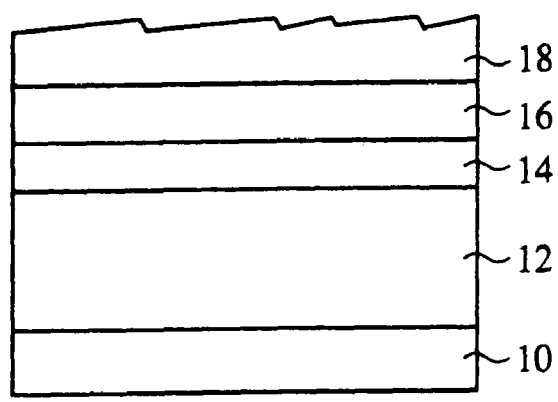
Figure 12C:
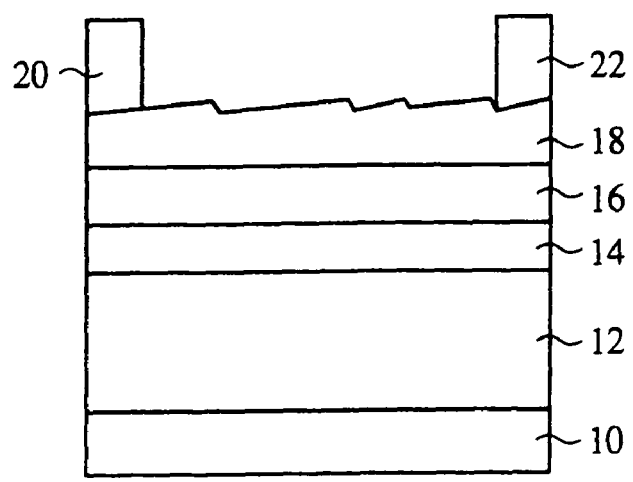

Next, the n-GaN cap layer 18 having the stepped surface is formed (see FIG. 12B). As conditions for growing the n-GaN cap layer 18 are, for example, the V/III ratio of the GaN is controlled to be V/III>10000, the growing rate is retained to be 20 angstrom/s or below, and $H_2$ gas alone is the carrier of the raw material gases. In the temperature decreasing processing following the growth of the n-GaN cap layer 18, 1 liter or more of $NH_3$ gas is flowed in the film forming chamber until the substrate temperature becomes 500° C. The n-GaN cap layer 18 is grown under such growing conditions, whereby the atomic layer steps of a plurality of the atomic layers can be formed on the upper surface, and the surface roughness can be reduced to a value as small as, e.g., 5 angstrom or less.

Then, Al/Ti is vapor deposited by, e.g., vacuum vapor deposition on the n-GaN cap layer 18 having the upper surface stepped in a prescribed region to form an Al/Ti film. Then, the deposited Al/Ti film is patterned to form the source electrode 20 and the drain electrode 22 of the Al/Ti (see FIG. 12C).

Next, a resist is applied to the entire surface by, e.g., spin coating to form a resist film 60. Then, the resist film 60 is patterned by photolithography to form an opening 62 down to the n-GaN cap layer 18 in a prescribed region between the source electrode 20 and the drain electrode 22 (see FIG. 13A).

Figure 13A:
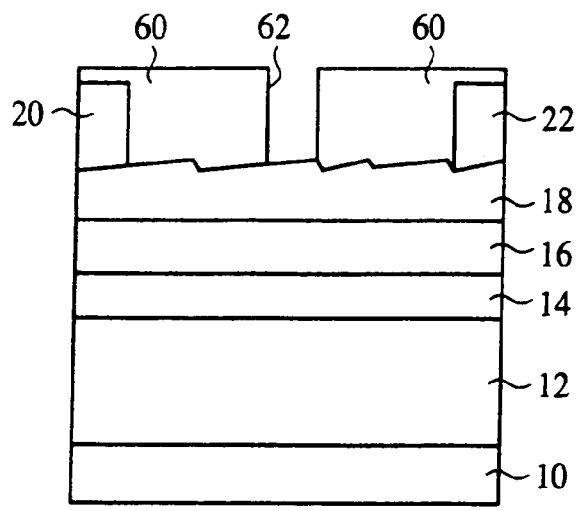
FIGS. 13A-13C are sectional views of the compound semiconductor device in the steps of the method for fabricating the same, which show the method (Part 2).
Figure 13B:
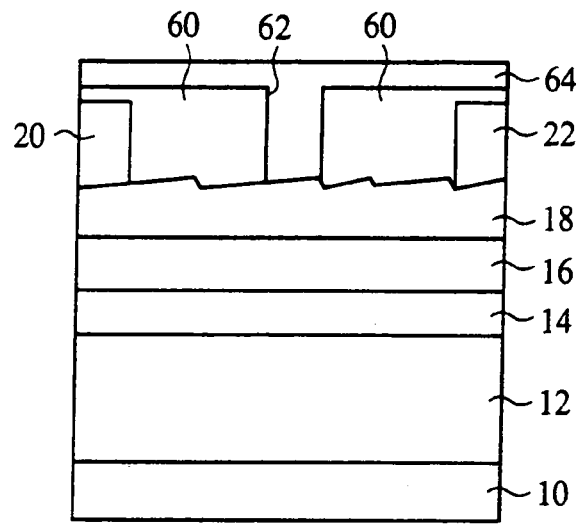
Figure 13C:
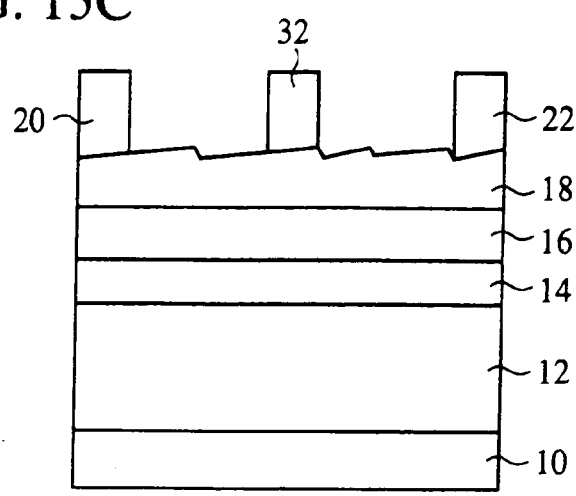

Then, Au/Ni is vapor deposited on the entire surface by, e.g., vacuum vapor deposition to form an Au/Ni film 64 (see FIG. 13B). Subsequently, the resist film 60 is removed to thereby lift off the unnecessary Au/Ni film 64. Thus, the gate electrode 32 of the Au/Ni film 64 is formed (see FIG. 13C).

Next, the SiN protection layer 34 is formed on the entire surface by, e.g., plasma CVD. Subsequently by etching using a mask, the SiN protection layer 34 formed on the entire surface is removed except that formed on the n-GaN cap layer 18 between the gate electrode 32 and the source electrode 20 and between the gate electrode 32 and the drain electrode 22.

Thus, the compound semiconductor device according to the present embodiment shown in FIG. 11 is fabricated.

As described above, according to the present embodiment, growth conditions, such as the V/III ratio of the GaN, the growing rate, etc., are controlled to thereby form the n-GaN cap layer 18 having the upper surface formed in the atomic layer steps and small surface roughness, whereby the electric field concentration on the upper surface of the n-GaN cap layer 18 can be mitigated. Thus, the generation of the gate leak current can be suppressed, and the voltage resistance can be improved.

A Third Embodiment

Figure 14:
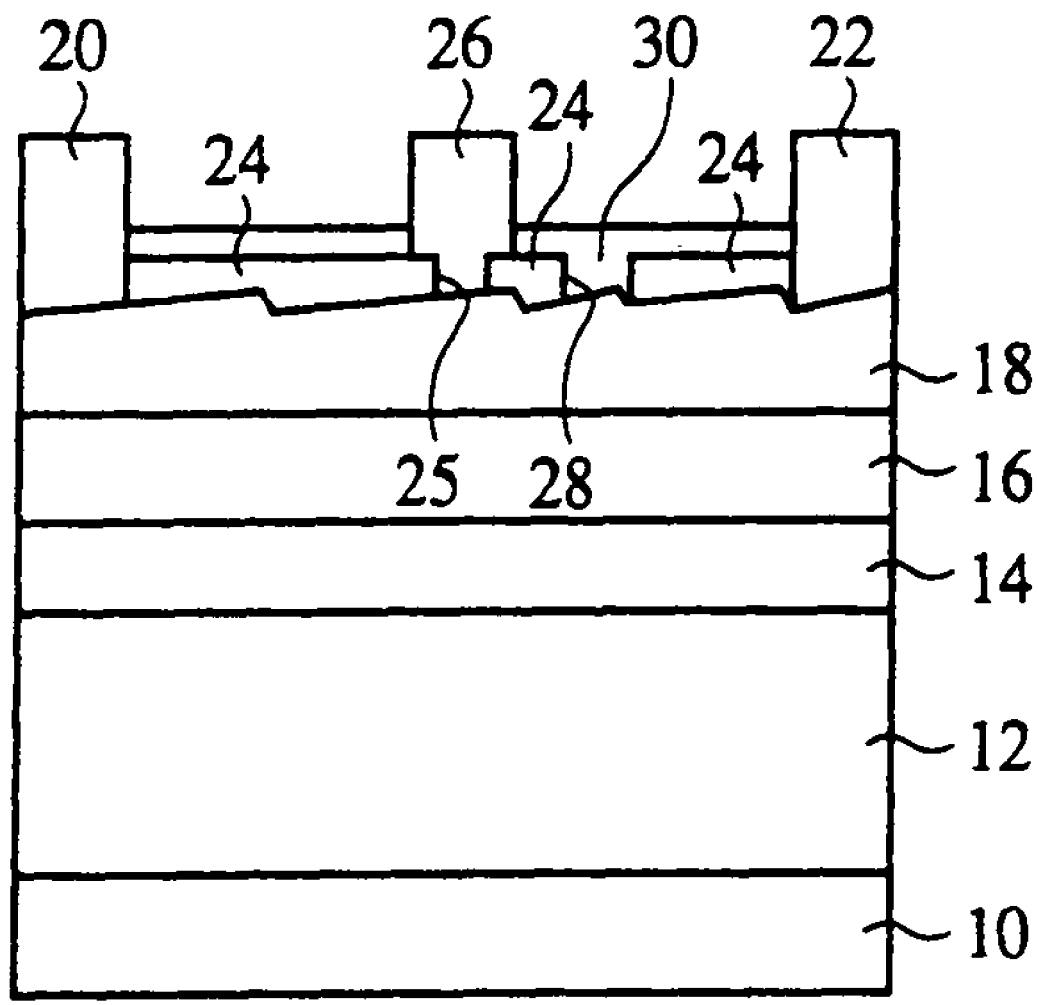
FIG. 14 is a sectional view of the compound semiconductor device according to a third embodiment of the present invention, which shows a structure thereof.
Figure 15:
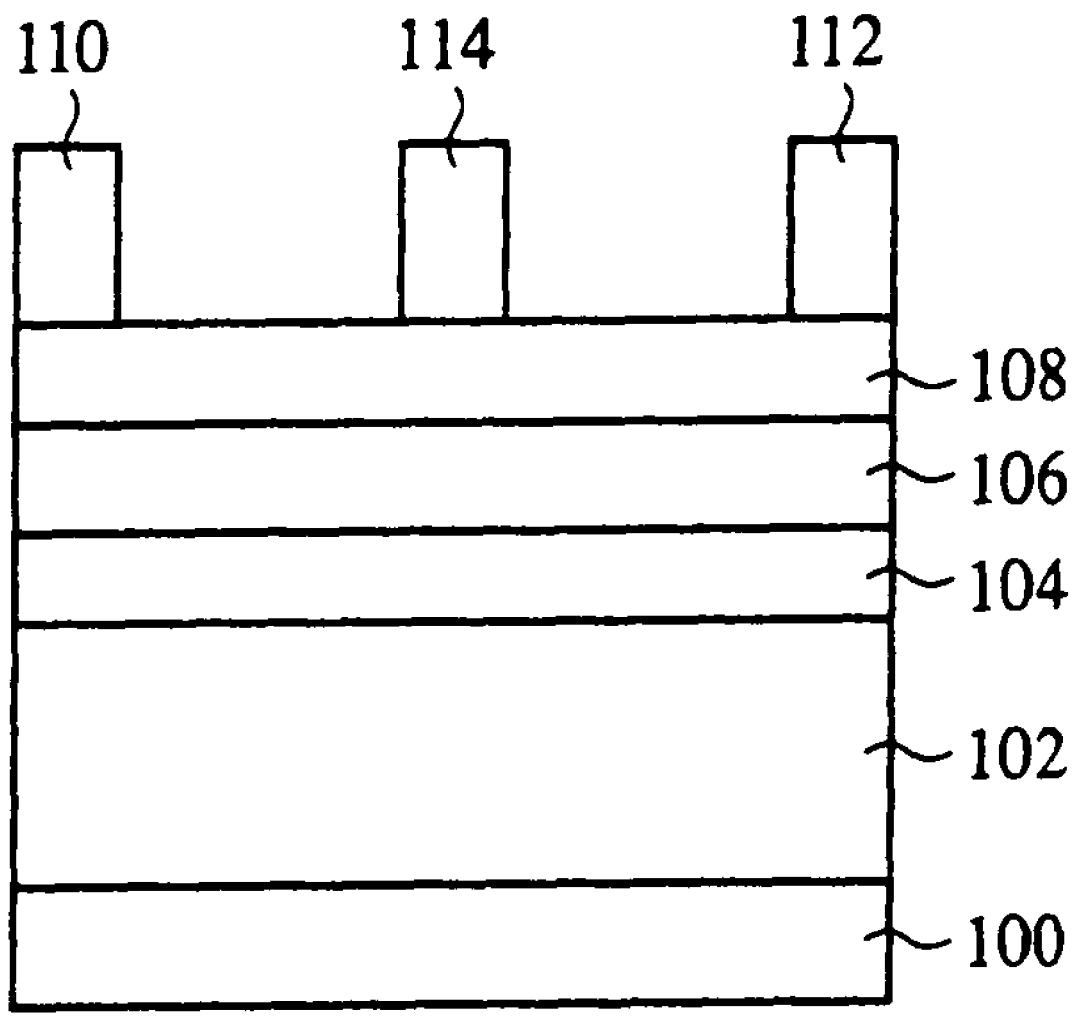
FIG. 15 is a sectional view of one example of the conventional HEMT structure using AlGaN/GaN hetero junction.

The compound semiconductor device according to a third embodiment of the present invention and the method for fabricating the semiconductor device will be explained with reference to FIG. 14. FIG. 14 is a sectional view of the compound semiconductor device according to the present embodiment, which shows a structure thereof. The same members of the present embodiment as those of the compound semiconductor device according to the first and second embodiment and the method for fabricating the semiconductor device are represented by the same reference numbers not to repeat or to simplify their explanation.

In the second embodiment described above, the compound semiconductor device including the SiN protection layer 34 shown in FIG. 3 has the n-GaN cap layer 18 formed under growing condition which permit the atomic layer steps to be formed on the upper surface, whereby the surface roughness of the n-GaN cap layer 18 is reduced. The compound semiconductor device according to the present embodiment corresponds to the compound semiconductor device according to the first embodiment including the first protection layer 24 and the second protection layer 30, which includes an n-GaN cap layer 18 formed under the same growing conditions for forming the n-GaN cap layer 18 having the atomic layer steps on the upper surface in the same way as in the second embodiment, whereby the surface roughness of said n-GaN cap layer 18 is reduced.

In the compound semiconductor device according to the present embodiment, as shown n FIG. 14, the compound semiconductor device according to the first embodiment shown FIG. 1 includes the n-GaN cap layer 18 having the atomic layer steps formed on the upper surface, whereby the n-GaN cap layer 18 has a stepped upper surface of small surface roughness.

In the semiconductor device according to the first embodiment shown in FIG. 1, n-GaN cap layer 18 has the upper surface in the atomic layer steps of small surface roughness, whereby in addition to the effect of improving the voltage resistance by the provision of the second protection layer 30, the configuration of the sides of the first protection layer 24 in contact with the gate electrode, etc., the electric field concentration is mitigated by the flat upper surface of the n-GaN cap layer 18, and the voltage resistance can be more improved.

The compound semiconductor device according to the present embodiment can be fabricated by the method for fabricating the compound semiconductor device according to the first embodiment in which the n-GaN cap layer 18 is formed under the same growing conditions as in the second embodiment.

Modified Embodiments

The present invention is not limited to the above-described embodiments and can cover other various modifications.

For example, in the above-described embodiments, the SiC substrates 20 are used. However, SiC substrates are not essential, and in place of the SiC substrates 10, sapphire substrates, GaN substrates, Si substrate, etc. can be used.

In the above-described embodiments, the first protection layer 24 and the second protection layer 30 are formed of SiN. However, the material of the first protection layer 24 and the second protection layer 30 is not limited to SiN. For example, the first protection layer 24 is formed of SiN, MgO or ZnO, and the second protection layer 30 is formed of $SiO_2$, SiON or AlN.

In the above-described embodiments, one SiN layer of a nitrogen content ratio of 20% or less is formed as the first protection layer. However, the first protection layer is not essentially a single layer and can have a layer structure. For example, a plurality of SiN films of different nitrogen content ratios are formed one on another to form a layer film, and the layer film may be used as the first protection layer.

The composition of the AlGaN layer of the n-AlGaN electron supplying layer 16, etc. of the above-described embodiments may satisfy $Al_xGa_{(1-x)}N$ ($0<x\leq1$). The Al composition is suitably changed to thereby adjust the concentration of the two-dimensional electron gas. Furthermore, the Al composition is suitably adjusted to thereby adjust the surface roughness of the AlGaN layer. For example, the AlGaN layer forming the compound semiconductor device can have an Al composition, i.e., a value of x in the range of 0.15-0.3.

In the above-described embodiments, the i-AlGaN spacer layer 14 is provided but is not essential.

What is claimed:

1. A method for fabricating a compound semiconductor device comprising: a GaN active layer formed over a semiconductor substrate; an AlGaN electron supplying layer formed over the GaN active layer; a GaN cap layer formed over the AlGaN electron supplying layer; a source electrode and a drain electrode formed on the GaN cap layer; and a gate electrode formed on the GaN cap layer between the source electrode and the drain electrode, wherein
in forming the GaN cap layer, the GaN cap layer is formed with a stepped upper surface having steps of atomic layers of a 1-5 nm height formed on the upper surface.

2. A method for fabricating a compound semiconductor device according to claim 1, wherein
in forming the GaN cap layer, a V/III ratio of a raw material gas for forming the GaN cap layer is controlled so as to make a ratio of Ga to N larger than 10000 to thereby form the GaN cap layer with the stepped upper surface.

3. A method for fabricating a compound semiconductor device comprising:
forming a GaN active layer over a semiconductor substrate;
forming an AlGaN electron supplying layer over the GaN active layer;
forming a GaN cap layer over the AlGaN electron supplying layer; and
forming a source electrode, a drain electrode and a gate electrode on the GaN cap layer, wherein
in forming the GaN cap layer, a V/III ratio of a raw material gas for forming the GaN cap layer is controlled so as to make a ratio of Ga to N larger than 10000 to thereby grow the GaN cap layer at 20 Å/s or below.

4. A method for fabricating a compound semiconductor device according to claim 3, wherein
hydrogen alone is used as a carrier of source gas of Ga and N during growth of GaN.

5. A method for fabricating a compound semiconductor device according to claim 3, wherein
gaseous atmosphere containing ammonia is provided after the growth of GaN.

6. A method for fabricating a compound semiconductor device according to claim 3, further comprising:
forming a protection layer on the GaN cap layer.

* * * * *